United States Patent
Vendier et al.

(10) Patent No.: US 9,232,631 B2
(45) Date of Patent: Jan. 5, 2016

(54) HYPERFREQUENCY INTERCONNECTION DEVICE

(71) Applicants: THALES, Neuilly-sur-Seine (FR); CENTRE NATIONAL D'ETUDES SPATIALES, Paris (FR)

(72) Inventors: Olivier Vendier, Toulouse (FR); David Nevo, Toulouse (FR); Antoine Renel, Toulouse (FR); Beatrice Espana, Toulouse (FR)

(73) Assignees: Thales (FR); Centre National D'Etudes Spatiales (FR)

( * ) Notice: Subject to any disclaimer, the term of this patent is extended or adjusted under 35 U.S.C. 154(b) by 0 days.

(21) Appl. No.: 14/575,720

(22) Filed: Dec. 18, 2014

(65) Prior Publication Data

US 2015/0181694 A1 Jun. 25, 2015

(30) Foreign Application Priority Data

Dec. 20, 2013 (FR) ...................................... 13 03024

(51) Int. Cl.
*H05K 1/02* (2006.01)
*H01P 1/04* (2006.01)
*H01P 5/02* (2006.01)
*B22F 7/04* (2006.01)
*H05K 1/11* (2006.01)
*H05K 3/10* (2006.01)
*H01L 23/00* (2006.01)

(52) U.S. Cl.
CPC ............... *H05K 1/0237* (2013.01); *B22F 7/04* (2013.01); *H01L 24/01* (2013.01); *H01P 1/047* (2013.01); *H01P 5/028* (2013.01); *H05K 1/028* (2013.01); *H05K 1/0284* (2013.01); *H05K 1/111* (2013.01); *H05K 3/102* (2013.01); *H01L 2224/48137* (2013.01)

(58) Field of Classification Search
USPC ....................................................... 257/200
See application file for complete search history.

(56) References Cited

U.S. PATENT DOCUMENTS

| 5,012,321 | A | * | 4/1991 | Magarshack | ....... H01L 23/5222 257/664 |
| 5,349,317 | A | * | 9/1994 | Notani | ................ H01L 23/4985 257/E21.516 |
| 5,629,838 | A | * | 5/1997 | Knight | ............... G01R 31/3025 257/E23.01 |
| 2009/0029570 | A1 | | 1/2009 | Ikeuchi et al. | |

FOREIGN PATENT DOCUMENTS

| JP | H11-195909 A | 7/1999 |
| JP | 2007194270 A | 8/2007 |

OTHER PUBLICATIONS

William Berg, et al., "Elastomers Solve Tough Problems in High-Frequency Systems", EDN, Jan. 5, 1978, pp. 36-42, vol. 23, No. 1, XP001401755.

* cited by examiner

*Primary Examiner* — Thao P Le
(74) *Attorney, Agent, or Firm* — Baker & Hostetler LLP

(57) ABSTRACT

A hyperfrequency interconnection device between two components is provided, each component comprising an upper face and a signal line arranged on the upper face, the planes containing the upper faces of the components being separated by a distance known as the height difference. The hyperfrequency interconnection device comprises a substrate comprising a lower face and an upper face defined by a first axis and a second axis perpendicular to the first axis, a signal line arranged on the lower face of the substrate, a projection of the signal line into the plane of the upper face forming the first axis, at least two contact pads capable of electrically connecting the signal line of the device to the signal line of the components. The upper face of the substrate is corrugated along the second axis, capable of conferring on the substrate flexibility along the first axis.

9 Claims, 4 Drawing Sheets

HYPERFREQUENCY INTERCONNECTION DEVICE

CROSS-REFERENCE TO RELATED APPLICATION

This application claims priority to foreign French patent application No. FR 1303024, filed on Dec. 20, 2013, the disclosure of which is incorporated by reference in its entirety.

FIELD OF THE INVENTION

The invention is situated in the field of interconnection of active or passive components in hyperfrequency equipment. It more particularly relates to the interconnection of MMIC chips for an application in the Q/V band.

BACKGROUND

The microwave spectrum is generally defined for a range of frequencies between 0.3 and 1000 Gigahertz (GHz). For a frequency of use between 1 and 100 GHz, the term hyperfrequency is generally used. The hyperfrequency range is divided into several bands according to the various technical applications associated with them. These bands include the Q band, the frequency range of which is situated approximately between 30 and 50 GHz, and the V band, the frequency range of which is situated approximately between 50 and 75 GHz.

Hyperfrequency monolithic integrated circuits, also known by the name of MMIC (Monolithic Microwave Integrated Circuits) chip, are components used in electrical circuits having an application in the microwave field. These components are for example used in communication and navigation systems.

Each MMIC chip can include several circuits such as amplifier circuits, mixers or oscillators for example. An MMIC chip includes contact pads on its upper surface, around the edge, in order to provide the interface between hyperfrequency signals and low-frequency signals.

MMIC chips are generally mounted on a support surface, also called substrate, including metallization to ensure interconnection with the MMIC chip. The interconnection between the contact pads on the surface of the MMIC chip and the interconnection metallization of the substrate is generally achieved by wiring or microstrip.

At hyperfrequency, the connection between MMIC chips is generally made by means of wires or strips of gold. It should be noted that the invention does not apply to MMIC chips only, but more generally to active and/or passive components (for example planar filters, various transitions) present in microelectronic hybrid technology. The waveguide is a hollow mechanical part serving to propagate electromagnetic waves (the hyperfrequency signal) with a minimum of distortion, unlike planar devices and worse still, with a wired device that in this case has a considerable discontinuity, severely degrading the propagation of the wave. The main defect of these waveguides is their compatibility with components (active or passive) which are generally made using planar technology.

In hyperfrequency applications, a high interconnection density is required to allow the transmission of the requisite information. Moreover, the chips must be interconnected by means of connections that preserve the quality of the transmission line, i.e. which ensure the maintenance of the impedances of the transmission line and avoid any discontinuity causing undesirable reflections, and which are of relatively short length to minimize signal distortion.

The rise in frequency, notably in the Q and V bands, requires a considerable effort to be expended on the interconnection technology in order to limit adjustments that are generally expensive and difficult to implement. Moreover, the integration of hyperfrequency functions requires the use of heterogeneous technologies, i.e. components of different heights are integrated, which leads to consequent step heights which are unfortunately often crippling to the rise in frequency. More precisely, conventional interconnections between planar components can generate considerable electrical paths (for example up to 1 millimeter) with respect to the wavelength only in cases where the frequencies are lower.

Several interconnection technologies are known. Mention may notably be made of wired technology, which allows the connection of two components by wiring, but which has the consequence of severely limiting the bandwidth. It is also possible to use so-called "interposer" technology, but the interconnection this offers is not very reliable. Mention may be made of "flip chip" technology, which consists in flipping the chip in such a way that the contact surfaces are face to face. Flip chip technology poses technical and industrial problems that are hard to solve. Notably, control of the electromagnetic environment is problematic and spatial control and heat management are difficult. Moreover, flip chip technology does not allow for compensation for large step heights between components (typically greater than 100 µm).

SUMMARY OF THE INVENTION

The invention aims to reduce the importance of wired interconnections in hyperfrequency equipment being able to be used in high frequency ranges such as the Q and V bands, by proposing a hyperfrequency interconnection device allowing a wideband interconnection greater than 500 micrometers and being able to render the interconnection insensitive to thermal expansion and in accordance with, i.e. adaptable to, various step heights.

For this purpose, the subject of the invention is a hyperfrequency interconnection device between two components, each component comprising a substantially planar upper face and a signal line arranged on the upper face, the planes containing the upper faces of the components being substantially mutually parallel and separated by a distance known as the height difference, the hyperfrequency interconnection device comprising:
  a substrate comprising a lower face and a substantially planar upper face defined by a first axis and a second axis perpendicular to the first axis,
  a signal line arranged on the lower face of the substrate, a projection of the signal line into the plane of the upper face forming the first axis,
  at least two contact pads capable of electrically connecting the signal line of the device to the signal line of each component,
characterized in that the upper face of the substrate is corrugated along the second axis, capable of conferring to the substrate flexibility along the first axis.

BRIEF DESCRIPTION OF THE DRAWINGS

The invention will be better understood and other advantages will become apparent upon reading the detailed description of an embodiment given by way of example, a description illustrated by the attached drawing wherein.

For the sake of clarity, the same elements bear the same reference numbers in the various figures.

DETAILED DESCRIPTION

Figure 1A:
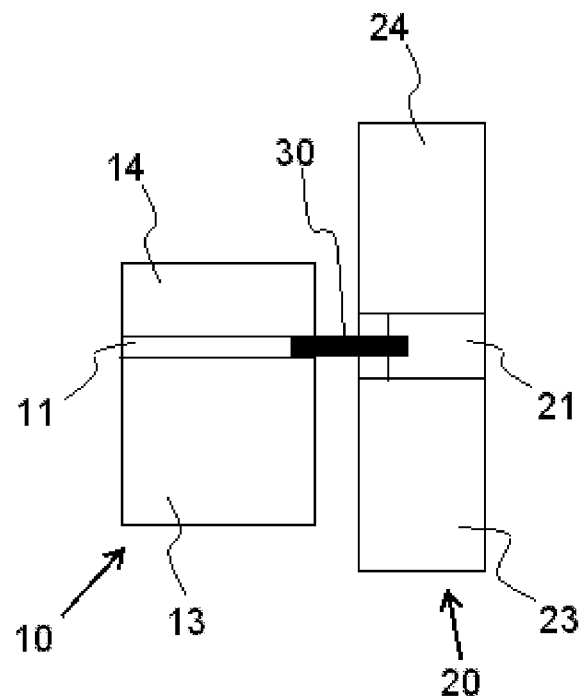
FIGS. 1a and 1b schematically represent an interconnection of two components by wiring of the prior art.
Figure 1B:
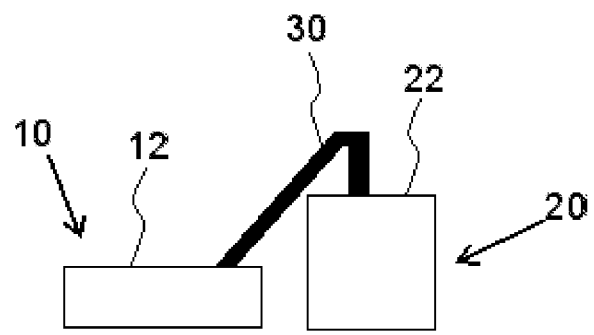

FIGS. 1a and 1b schematically represent an interconnection of two components 10 and 20 by wiring of the prior art. FIG. 1a is a top view of the components and the connection. FIG. 1b is a front view of the components and the connection. The component 10 comprises an upper face 12 on which are arranged a signal line 11 and two ground planes 13 and 14 on either side of the signal line 11. Similarly, the component 20 comprises an upper face 22 on which are arranged a signal line 21 and two ground planes 23 and 24 on either side of the signal line 21. The signal lines 11 and 21 can for example be so-called microstrip lines. The interconnection of the components 10 and 20 is made by wiring. In other words, the cable 30 interconnects the two components 10 and 20 by connecting the signal lines 11 and 21. As highlighted in FIG. 1b, the components 10 and 20 do not have the same height, leading to a step height or difference in the height of the components. In the case of a difference in the height of the components, the cable 30 is necessarily longer than in the case where the components are of identical height. This type of interconnection can make it possible to obtain good electrical performance even for very high frequencies, but for a relatively restricted bandwidth compared with the proposed interconnection device, and for a limited height difference and intercomponent distance.

Figure 2:
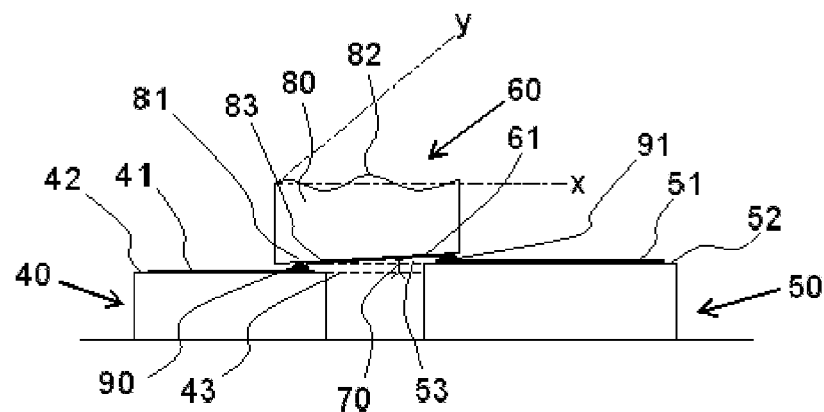
FIG. 2 schematically represents a first variant of the hyperfrequency interconnection device according to the invention.

FIG. 2 schematically represents a first variant of the hyperfrequency interconnection device according to the invention. The hyperfrequency interconnection device 60 interconnects two components 40 and 50. The component 40 comprises a substantially planar upper face 42 and a signal line 41 arranged on the upper face 42. Similarly, the component 50 comprises a substantially planar upper face 52 and a signal line 51 arranged on the upper face 52. The planes 43 and 53 containing the upper faces 42 and 52 of the components 40 and 50 are substantially mutually parallel and separated by a distance known as the height difference 70. The hyperfrequency interconnection device 60 comprises a substrate 80 comprising a lower face 81 and a substantially planar upper face 82 defined by a first X axis and a second Y axis perpendicular to the first X axis. The hyperfrequency interconnection device 60 comprises a signal line 83 arranged on the lower face 81 of the substrate 80, a projection of the signal line 83 into the XY plane of the upper face 82 forming the first X axis. The hyperfrequency interconnection device 60 furthermore comprises at least two contact pads 90 and 91 capable of electrically connecting the signal line 83 of the device 60 to the signal lines 41 and 51 of each component 40 and 50 respectively. According to the invention, the upper face 82 of the substrate 80 is corrugated along the second Y axis, capable of conferring to the substrate 80 flexibility along the first X axis.

Each material having a certain flexibility, it is obvious that the capability of conferring flexibility to the substrate is to be understood as the capability of increasing the flexibility of the substrate.

The corrugation of one face consists in a series of grooves along one axis on the face, known as the corrugation axis, the grooves being parallel with this corrugation axis and therefore mutually parallel. The grooves can have different corrugation patterns. The corrugation patterns are defined by considering a cross section of the corrugated face along an axis perpendicular to the corrugation axis. A very well known corrugation face is corrugated iron. In our application, the term "corrugated" will be considered synonymous with the term "waved". Corrugation, as described here, does not depend on the method of fabrication. It is thus possible to obtain a corrugated face by molding, milling, folding or three-dimensional printing for example. In the wider sense, the waved face can have a cross section perpendicular to the corrugation axis that is substantially sinusoidal, but also triangular, crenellated or having any other pattern, which is repeated or alternated with another pattern, periodically or otherwise.

Figure 4:
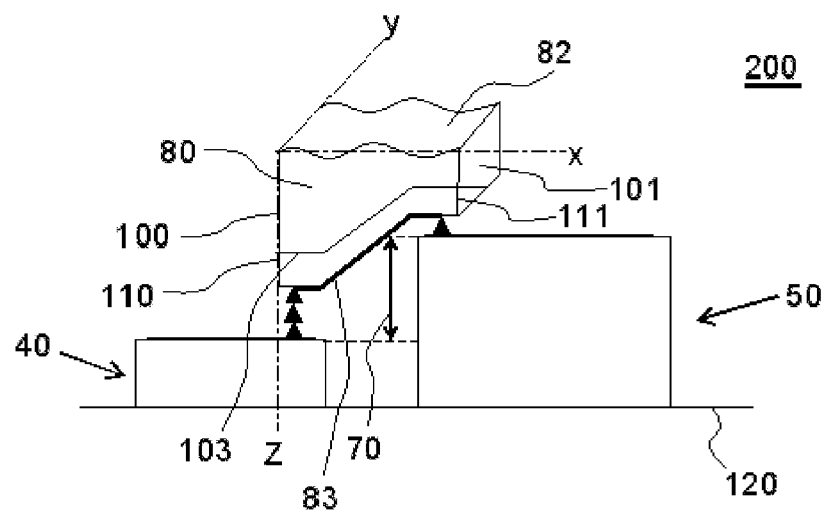
FIG. 4 schematically represents a third variant of the hyperfrequency interconnection device according to the invention.

FIG. 4 schematically represents a variant of the hyperfrequency interconnection device 60 according to the invention. In FIG. 4, the corrugated upper face 82 of the substrate 80 has a substantially sinusoidal cross section perpendicular to the second Y axis. In other words, the corrugation axis is the Y axis.

Figure 5:
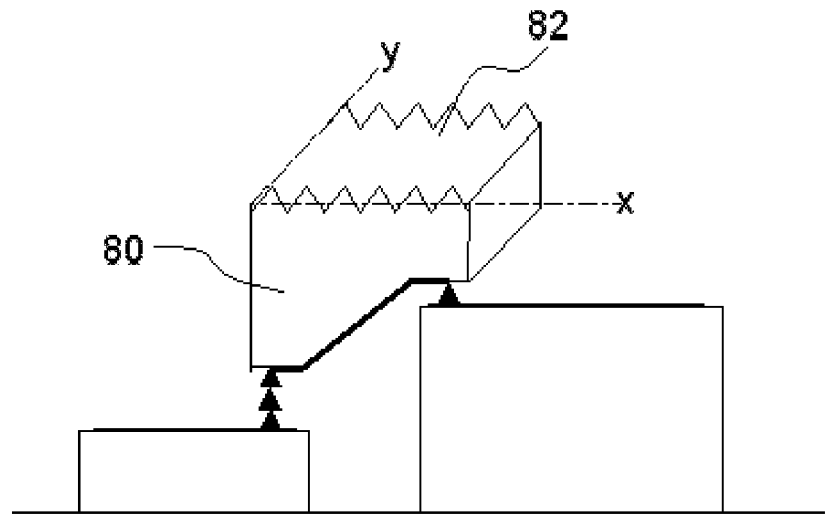
FIG. 5 schematically represents a fourth variant of the hyperfrequency interconnection device according to the invention.

FIG. 5 schematically represents another variant of the hyperfrequency interconnection device 60 according to the invention. In FIG. 5, the corrugated upper face 82 of the substrate 80 has a substantially triangular cross section perpendicular to the second Y axis.

Figure 6:
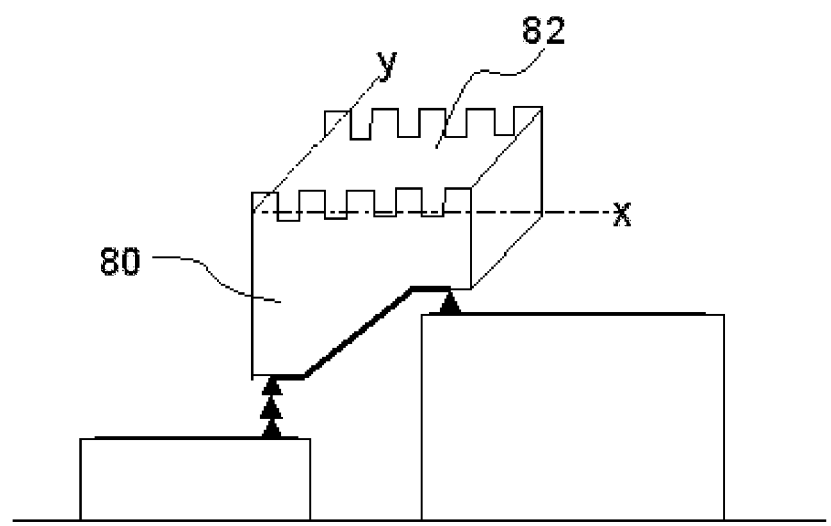
FIG. 6 schematically represents a fifth variant of the hyperfrequency interconnection device according to the invention.

FIG. 6 schematically represents another variant of the hyperfrequency interconnection device 60 according to the invention. In FIG. 6, the corrugated upper face 82 of the substrate 80 has a substantially crenellated cross section perpendicular to the second Y axis.

The cross section of the upper face 82 of the substrate 80 perpendicular to the second Y axis can take any other geometrical shape. It is also possible for the cross section of the upper face 82 of the substrate 80 perpendicular to the second Y axis to have different corrugation patterns. In other words, the corrugated upper face 82 of the substrate 80 can for example have a substantially crenellated cross section perpendicular to the second Y axis on one part of the face and a substantially sinusoidal cross section perpendicular to the second Y axis.

The upper face 82 of the substrate 80 corrugated along the second Y axis confers on the substrate 80 high rigidity along the Y axis. Moreover, the corrugation of the upper face 82 confers on the substrate 80 flexibility along the X axis. This property is particularly beneficial since it happens that the components are composed of different materials. Materials of different natures will expand differently. For example in the spatial domain, an item of hyperfrequency equipment 200 comprising at least two components 40, 50 arranged on a support 120 and the hyperfrequency interconnection device 60 between at least two components 40 and 50 is subjected to temperatures that can vary from −55° C. to 125° C. Components with different thermal expansion coefficients will expand differently, which can have as consequence a malfunction of the interconnection between the components.

However, the upper face 82 of the substrate 80 being corrugated along the Y axis, the substrate will be flexible along the X axis. The flexibility of the substrate 80 along the X axis makes it possible to compensate for the differences in thermal expansions of the components. The hyperfrequency interconnection device 60 according to the invention is said to be insensitive to expansions.

Figure 3:
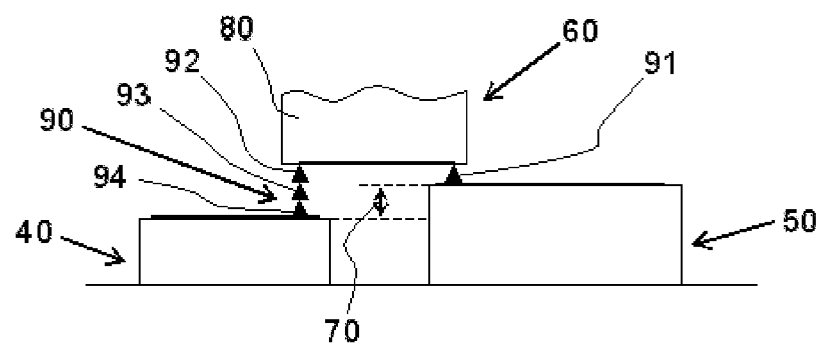
FIG. 3 schematically represents a second variant of the hyperfrequency interconnection device according to the invention.

According to the invention, the hyperfrequency interconnection device 60 comprises means capable of compensating for the height difference 70 of the components 40 and 50. FIG. 3 schematically represents a variant of the hyperfrequency interconnection device 60 according to the invention. According to the invention, the contact pad 90 includes several stages, belonging to the means capable of compensating for the height difference 70 of the components 40 and 50. In FIG. 3, the contact pad 90 includes three stages 92, 93, 94, but it could contain two, or more than three, thereof. One stage is a contact pad. In other words, several contact pads are superimposed in order to compensate for the height difference 70 of the components 40 and 50. Generally, it is possible to superimpose up to eight contact pads, which makes it possible to compensate for a height difference 70 of the components of up to 100 micrometers.

FIG. 4 schematically represents a variant of the hyperfrequency interconnection device 60 according to the invention making it possible to compensate for a height difference 70 of the components greater than 100 micrometers. The substrate 80 includes two lateral faces 100 and 101 substantially perpendicular to the first X axis. A substrate height 80 is the distance between the upper face 82 and the lower face along a third Z axis, substantially perpendicular to the first X axis and to the second Y axis. According to the invention, the two lateral faces 100 and 101 of the substrate 80 have different substrate heights 110 and 111, belonging to the means capable of compensating for the height difference 70 of the components. Thus, the shape of the substrate 80 makes it possible to compensate for the height difference 70 of the components.

Moreover, the hyperfrequency interconnection device can comprise a second signal line 103 arranged on the lower face of the substrate 80, capable of interconnecting additional components (not represented in FIG. 4).

Figure 7:
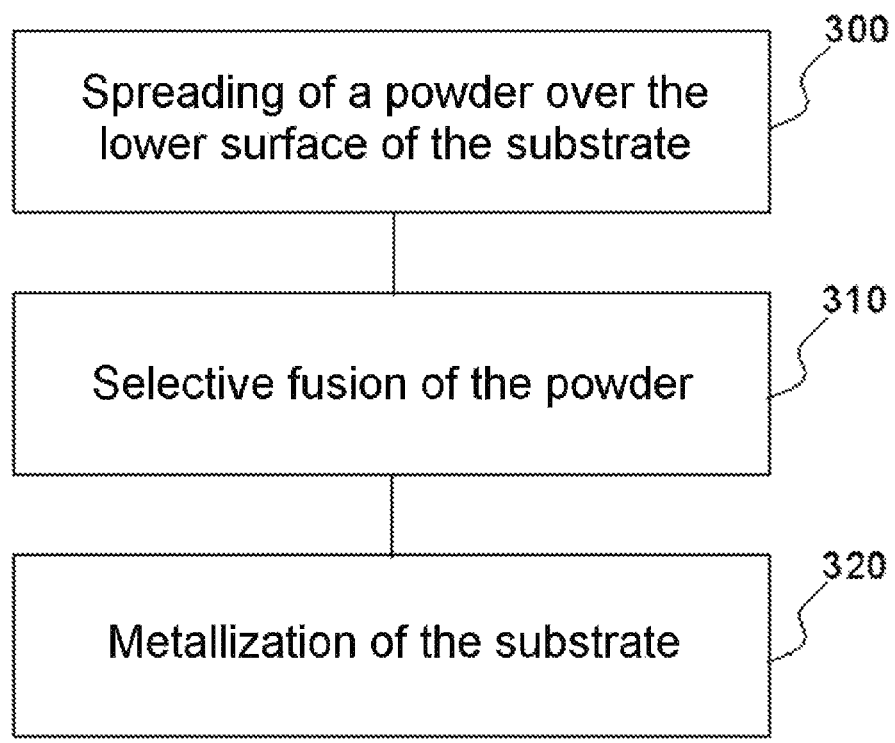
FIG. 7 schematically represents the steps of the method of fabrication of the substrate.

As represented schematically in FIG. 7, such a substrate 80 can be produced by direct fabrication. Indeed, it is possible to define the three-dimensional geometry of the substrate by means of computer-assisted design software. The fabrication method includes the following steps: a powder is spread over the lower face of the substrate (step 300). An operation of selective fusion of the powder spread over the lower face of the substrate (step 310) makes it possible to define the geometry of the substrate. The substrate can then be metalized (step 320) to produce the hyperfrequency lines. Three-dimensional fabrication or additive fabrication are easier to implement than subtractive technology such as milling.

It will of course be understood that the means capable of compensating for the height difference 70 of the components can be the substrate 80 with different substrate heights and the superimposition of contact pads, in order to make it possible to compensate for a very large height difference 70.

The invention is applicable in a frequency domain from 0.3 GHz. More particularly, the invention can be applied for frequencies of use between 1 and 1000 GHz and preferably in the Q band, the frequency range of which is situated approximately between 30 and 50 GHz, and in the V band, the frequency range of which is situated approximately between 50 and 75 GHz.

The hyperfrequency interconnection device according to the invention thus makes it possible to reduce the importance of wired interconnections in the production of hyperfrequency equipment. It is flexible and compliant to make it able to adapt to the heterogeneous environments imposed by sometimes strict production constraints.

Of course, the invention is not limited to the embodiment described and variant embodiments can be contributed thereto without departing from the scope of the invention as defined by the claims.

The invention claimed is:

1. A hyperfrequency interconnection device between two components, each component comprising a substantially planar upper face and a signal line arranged on the upper face, the planes containing the upper faces of the components being substantially mutually parallel and separated by a distance known as the height difference, the hyperfrequency interconnection device comprising:
    a substrate comprising a lower face and a substantially planar upper face defined by a first axis and a second axis perpendicular to the first axis,
    a signal line arranged on the lower face of the substrate, a projection of the signal line into the plane of the upper face forming the first axis,
    at least two contact pads capable of electrically connecting the signal line of the device to the signal line of each component, and
    wherein the upper face of the substrate is waved along the second axis, capable of conferring to the substrate flexibility along the first axis.

2. The device according to claim 1, further comprising means capable of compensating for the height difference of the components.

3. The device according to claim 2, wherein one of the at least two contact pads includes several stages, belonging to the means capable of compensating for the height difference of the components.

4. The device according to claim 1, wherein the substrate includes two lateral faces substantially perpendicular to the first axis, and a substrate height is the distance between the upper face and the lower face along a third axis, substantially perpendicular to the first axis and to the second axis, and the two lateral faces of the substrate have different substrate heights, belonging to the means capable of compensating for the height difference of the components.

5. The device according to claim 1, further comprising a second signal line arranged on the lower face of the substrate, capable of interconnecting additional components.

6. The device according to claim 1, wherein the waved upper face of the substrate has a substantially sinusoidal cross section perpendicular to the second axis.

7. The device according to claim 1, wherein the waved upper face of the substrate has a substantially triangular cross section perpendicular to the second axis.

8. The device according to claim 1, wherein the waved upper face of the substrate has a substantially crenellated cross section perpendicular to the second axis.

9. An item of hyperfrequency equipment comprising at least two components arranged on a support and the hyperfrequency interconnection device between the at least two components according to claim 1.

* * * * *